(12) United States Patent
Kadotani et al.

(10) Patent No.: US 9,442,353 B2
(45) Date of Patent: Sep. 13, 2016

(54) PROJECTOR WITH FLEXIBLE PRINTED CIRCUIT BOARD FOR LIGHT SOURCE

(75) Inventors: Norikazu Kadotani, Matsumoto (JP); Akira Hashimoto, Shiojiri (JP); Hiroshi Kobayashi, Shiojiri (JP); Kaname Nagatani, Matsumoto (JP); Norio Nakamura, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 146 days.

(21) Appl. No.: 14/124,552

(22) PCT Filed: Jun. 13, 2012

(86) PCT No.: PCT/JP2012/003860
§ 371 (c)(1),
(2), (4) Date: Dec. 6, 2013

(87) PCT Pub. No.: WO2012/176404
PCT Pub. Date: Dec. 27, 2012

(65) Prior Publication Data
US 2014/0104585 A1    Apr. 17, 2014

(30) Foreign Application Priority Data

Jun. 22, 2011  (JP) .................................. 2011-138236
Mar. 14, 2012  (JP) .................................. 2012-056945

(51) Int. Cl.
G03B 21/20    (2006.01)
H04N 9/31    (2006.01)
(Continued)

(52) U.S. Cl.
CPC ........... *G03B 21/20* (2013.01); *G03B 21/2033* (2013.01); *G03B 21/2073* (2013.01); *G03B 21/2093* (2013.01); *H04N 9/315* (2013.01); *H04N 9/3173* (2013.01); *F21V 19/003* (2013.01); *F21V 19/045* (2013.01); *F21V 23/004* (2013.01); *H05K 1/189* (2013.01); *H05K 2201/10106* (2013.01)

(58) Field of Classification Search
CPC .. G03B 21/20; G03B 21/2033; H04N 9/315; H05K 1/189; F21V 19/003; F21V 19/045; F21V 23/004
See application file for complete search history.

(56) References Cited

U.S. PATENT DOCUMENTS 7,275,851 B2  10/2007  Sakurai
7,557,451 B2   7/2009  Shinojima
(Continued)

FOREIGN PATENT DOCUMENTS

CN        1755424 A    4/2006
DE    102009045919 A1  4/2011
(Continued)

*Primary Examiner* — Sultan Chowdhury
*Assistant Examiner* — Magda Cruz
(74) *Attorney, Agent, or Firm* — Oliff PLC (57) ABSTRACT

A projector (1) includes a light source device (2), a light modulating device (5) configured to modulate a light beam emitted from the light source device, a projection optical device (7) configured to project the light beam modulated by the light modulating device, and a flexible printed circuit board (6), one end of which is connected to the light modulating device (5). The light source device (2) includes a light emitting device mounted on the flexible printed circuit board (6). The flexible printed circuit board is bent, whereby the light source device is disposed in an emission position where the light source device (2) emits the light beam to the light modulating device (5).

9 Claims, 5 Drawing Sheets (51) Int. Cl.
  *F21V 19/00* (2006.01)
  *F21V 19/04* (2006.01)
  *F21V 23/00* (2015.01)
  *H05K 1/18* (2006.01)

(56) References Cited

U.S. PATENT DOCUMENTS

| | | |
|---|---|---|
| 8,072,765 B2 | 12/2011 | Yumoto et al. |
| 2005/0213924 A1 | 9/2005 | Sakurai et al. |
| 2005/0285973 A1* | 12/2005 | Singh ............... H01L 27/14618 348/374 |
| 2006/0066812 A1 | 3/2006 | Yanai |
| 2007/0281223 A1* | 12/2007 | Mochizuki ........ G02F 1/133512 430/5 |
| 2010/0073959 A1 | 3/2010 | Hamada |
| 2010/0091501 A1* | 4/2010 | Tan ....................... H01L 33/486 362/294 |
| 2010/0321318 A1 | 12/2010 | Oohira |
| 2012/0262681 A1 | 10/2012 | Grabmaier |

FOREIGN PATENT DOCUMENTS

| | | |
|---|---|---|
| JP | S63-266311 A | 11/1988 |
| JP | A-10-049065 | 2/1998 |
| JP | A-2000-227605 | 8/2000 |
| JP | A-2001-117093 | 4/2001 |
| JP | A-2002-006313 | 1/2002 |
| JP | A-2002-182205 | 6/2002 |
| JP | 2003-090993 A | 3/2003 |
| JP | A-2004-004581 | 1/2004 |
| JP | A-2004-177876 | 6/2004 |
| JP | A-2005-115337 | 4/2005 |
| JP | 2005-275076 A | 10/2005 |
| JP | A-2006-133448 | 5/2006 |
| JP | 2006-178138 A | 7/2006 |
| JP | 2007-323017 A | 12/2007 |
| JP | A-2007-333773 | 12/2007 |
| JP | 2009-025602 A | 2/2009 |
| JP | A 2009-251424 | 10/2009 |
| JP | A-2011-002553 | 1/2011 |
| WO | 2008-090646 A1 | 7/2008 |
| WO | 2011-048146 A1 | 4/2011 |

* cited by examiner

PROJECTOR WITH FLEXIBLE PRINTED CIRCUIT BOARD FOR LIGHT SOURCE

BACKGROUND

1. Technical Field

The present invention relates to a projector.

2. Related Art

In the past, there is known a projector including a light source device, a light modulating device that modulates a light beam emitted from the light source device, and a projection optical device that projects the light beam modulated by the light modulating device (see, for example, JP-A-2007-333773).

In the projector described in PTL1, in order to reduce the size of the projector, as the light source device, an LED (Light Emitting Diode) light source is adopted rather than a light source lamp of an discharge type.

This LED light source includes a configuration in which a light emitting device (a light emitting section) is mounted on an LED circuit board.

The light modulating device (a liquid crystal device) is electrically connected to, via a flexible printed circuit board, a control board that controls the operations of the light modulating device and the LED light source. A signal is output from the control board via the flexible printed circuit board, whereby the light modulating device is controlled.

Similarly, a connector provided on the LED circuit board and the control board are connected by the flexible printed circuit board and a signal is output from the control board via the flexible printed circuit board, whereby the LED light source is controlled.

However, the projector described in PTL 1 has a problem in that connecting paths between the control board and the light modulating device and between the control board and the LED light source are two paths (two flexible printed circuit boards) independent from each other and the reduction in the size of the projector is prevented by wiring of the two paths.

In particular, when the projector is configured as a pico-projector (also referred to as micro-projector or nano-projector in some case) used together with an electronic device (e.g., incorporated in the electronic device) such as a digital camera, a cellular phone, or a notebook PC (Personal Computer), it is difficult to design the projector to a desired thickness dimension.

SUMMARY

An advantage of some aspects of the invention is to provide a projector that can be reduced in size.

An aspect of the invention is directed to a projector including a light source device, a light modulating device configured to modulate a light beam emitted from the light source device, and a projection optical device configured to project the light beam modulated by the light modulating device. The projector includes a flexible printed circuit board, one end of which is connected to the light modulating device. The light source device includes a light emitting device mounted on the flexible printed circuit board. The flexible printed circuit board is bent, whereby the light source device is disposed in an emission position where the light source device emits the light beam to the light modulating device.

According to the aspect of the invention, the light source device includes the light emitting device and is mounted on the flexible printed circuit board, the one end of which is connected to the light modulating device.

Consequently, connecting paths between a control board, which controls the operations of the light source device and the light modulating device, and the light modulating device and between the control board and the light source device can be integrated into one path (one flexible printed circuit board). Therefore, it is possible to simplify wiring between the control board and the light modulating device and between the control board and the light source device and realize a reduction in the size of the projector.

In particular, when the projector according to the aspect of the invention is configured as a pico-projector, the projector is suitable because it is possible to design the projector to a sufficiently small desired size.

Compared with the configuration in the past, it is unnecessary to separately provide, for example, a mounting board (an LED circuit board) for mounting the light emitting device, a flexible printed circuit board for connecting the mounting board and the control board, and a connector to which the flexible printed circuit board is connected. Therefore, since the number of components is reduced, it is possible to realize a further reduction in the size of the projector and reduce manufacturing costs for the projector.

The flexible printed circuit board is bent, whereby the light source device is disposed in an emission position where the light source device emits the light beam to the light modulating device.

Consequently, the light source device can be disposed in the emission position simply by bending the flexible printed circuit board connected to the light modulating device. Therefore, it is possible to easily carry out assembly of the projector.

It is preferred that the projector of the aspect of the invention includes a housing in which the light source device, the light modulating device, and the projection optical device are housed. A positioning protrusion for positioning the light source device in the emission position is formed on the housing. The flexible printed circuit board includes a positioning hole in which the positioning protrusion is fitted. The positioning protrusion fits in the positioning hole to position the light source device in the emission position.

According to this configuration, the positioning protrusion is formed on the housing and the positioning hole is formed on the flexible printed circuit board. Therefore, simply by fitting the positioning protrusion in the positioning hole, it is possible to easily position the light source device in the emission position while simplifying the structure of the projector.

In the project of the aspect of the invention, it is preferred that the positioning protrusion is formed on the outer surface of the housing. An insert-through section for drawing around the flexible printed circuit board to the outside of the housing is formed in the housing. The flexible printed circuit board is drawn around to the outside of the housing via the insert-through section. A portion between the positioning hole and the one end is bent along the outer surface of the housing.

According to this configuration, the flexible printed circuit board is drawn around to the outside of the housing via the insert-through section. The portion between the positioning hole and the connecting position of the light modulating device is bent along the outer surface of the housing.

Consequently, by bringing the flexible printed circuit board into contact with the outer surface of the housing while bending the flexible printed circuit board as explained above, it is possible to satisfactorily maintain a fit state of the positioning protrusion in the positioning hole, i.e., satisfactorily maintain a positioned state of the light source device in the emission position.

In the project of the aspect of the invention, it is preferred that the positioning protrusion is formed on the outer surface of the housing. In the housing, a screw hole in which a screw is screwed and an insert-through section for drawing around the flexible printed circuit board to the outside of the housing are formed. The flexible printed circuit board includes a first fixing hole through which the screw is inserted. The projector includes a second fixing hole through which the screw is inserted and a holding member connected to the housing by the screw and configured to hold a part of the flexible printed circuit board between the holding member and the outer surface of the housing.

According to this configuration, since the projector includes the holding member and holds a part of the flexible printed circuit board between the holding member and the outer surface of the housing, it is possible to satisfactorily maintain a fit state of the positioning protrusion in the positioning hole, i.e., satisfactorily maintain a positioned state of the light source device in the emission position.

In the project of the aspect of the invention, it is preferred that the holding member is made of a thermally conductive material and is connected to the light source device via the flexible printed circuit board to be capable of transmitting heat.

According to this configuration, since the holding member is configured as explained above, it is possible to radiate heat generated by lighting driving for the light source device to the outside through a heat transmission path from the light source device to the flexible printed circuit board (patterned wiring) and the holding member while satisfactorily maintaining a positioned state of the light source device in the emission position. Therefore, it is possible to effectively suppress heat deterioration of the light source device.

In the project of the aspect of the invention, it is preferred that the flexible printed circuit board is formed such that the width dimension of a portion where the light source device is mounted is larger than the width dimension of the other portions.

According to this configuration, since the flexible printed circuit board is configured as explained above, it is possible to increase a heat capacity of the portion where the light source device is mounted compared with the other portions. Therefore, it is possible to effectively radiate heat generated by lighting driving for the light source device to the portion and effectively suppress heat deterioration of the light source device.

It is preferred that the projector of the aspect of the invention includes a housing in which the light source device, the light modulating device, and the projection optical device are housed. In a position where the light modulating device is disposed in the housing, an insert-through section for drawing around the flexible printed circuit board to the outside of the housing is formed. The housing includes a first housing section and a second housing section formed separate from each other and combined with each other. The light modulating device is disposed in a connecting position of the first housing section and the second housing section. The insert-through section is formed by combining the first housing section and the second housing section.

According to this configuration, the insert-through section is formed in the position where the light modulating device is disposed in the housing. Therefore, it is possible to draw around the flexible printed circuit board to the outside of the housing via the insert-through section.

The insert-through section is formed by combining the first and second housing sections.

Consequently, it is possible to easily form the insert-through section compared with a housing formed of one member.

If an illuminating system such as the light source device is housed in the first housing section and the projection optical device is housed in the second housing section, in a state in which the light source device and the like are housed in the housing, it is possible to easily carry out adjustment (optical axis adjustment) of a positional relation between the illuminating system such as the light source device and the projection optical device.

It is preferred that the projector of the aspect of the invention includes a connecting member configured to integrate the first housing section and the second housing section.

According to this configuration, since the projector includes the connecting member, even if the housing includes the first and second housing sections formed separate from each other, it is possible to integrate the first and second housing sections using the connecting member and increase the strength of the housing.

In the project of the aspect of the invention, it is preferred that the housing is formed to have a substantially rectangular parallelepiped shape by combining the first housing section and the second housing section. The connecting member includes a connecting member body attached to a first side surface of the housing to extend over the connecting position and a reinforcing section configured to project from the connecting member body and disposed to be opposed to a second side surface different from the first side surface in the housing to extend over the connecting position.

According to this configuration, since the connecting member includes the connecting member body and the reinforcing section, it is possible to effectively increase the strength of the housing by reinforcing the housing with the connecting member body and the reinforcing section from the sides of the different two surfaces (the first and second side surfaces) of the housing to extend over the connecting position where strength is low.

In the project of the aspect of the invention, it is preferred that the insert-through section is formed on the second side surface.

According to this configuration, the insert-through section is formed on the second side surface. In other words, when the flexible printed circuit board is drawn around to the outside of the housing via the insert-through section, the flexible printed circuit board is drawn around to the side where the reinforcing section is disposed.

Consequently, it is possible to close the insert-through section and prevent a deficiency from occurring in the connecting portion of the light modulating device and the flexible printed circuit board while reinforcing the housing with the reinforcing section.

In the projector of the aspect of the invention, it is preferred that, on the outer surface of the housing, a positioning protrusion for positioning the light source device in the emission position and a screw hole in which a screw is fitted are formed. The flexible printed circuit board includes a first fixing hole through which the screw is inserted and a positioning hole in which the positioning protrusion is fitted. The positioning protrusion is fitted in the positioning hole to position the light source device in the emission position. The connecting member includes a second fixing hole through which the screw is inserted and a holding member connected to the housing by the screw and configured to hold a part of the flexible substrate between the holding member and the outer surface of the housing.

According to this configuration, the connecting member includes a function (the holding member) of maintaining a positioned state of the light source device in the emission position while including a function (the connecting member body and the reinforcing section) of increasing the strength of the housing.

Consequently, simply by connecting the single connecting member to the housing, it is possible to maintain the positioned state of the light source device in the emission position while increasing the strength of the housing. In other words, it is possible to easily carry out assembly of the projector.

DESCRIPTION OF EXEMPLARY EMBODIMENTS

Figure 1:
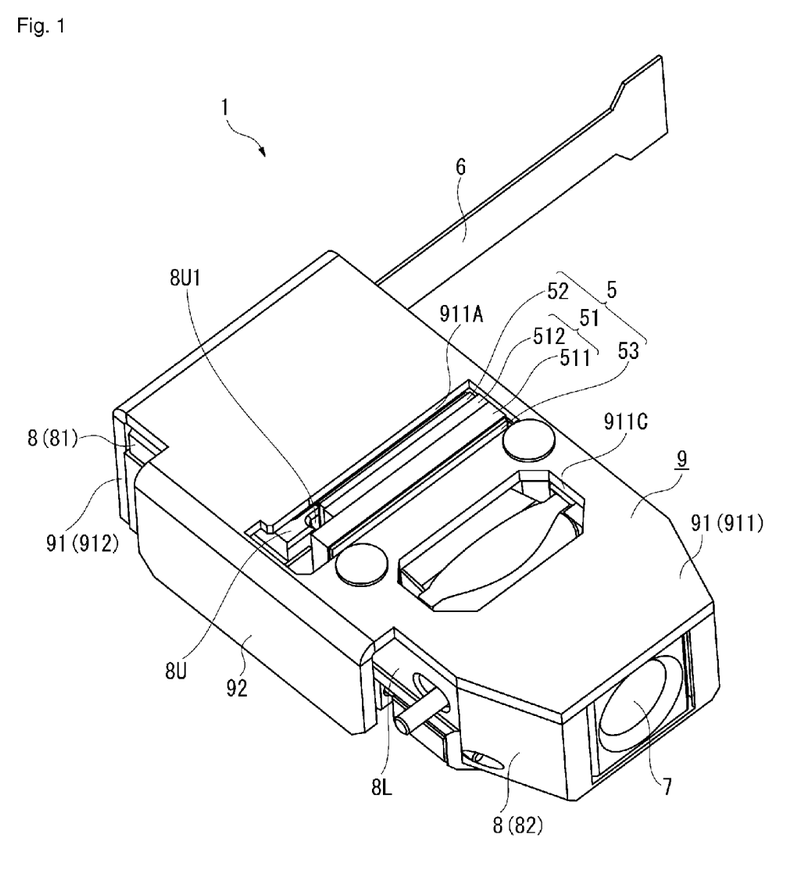
FIG. 1 is a diagram showing the configuration of a projector in an embodiment.
Figure 2:
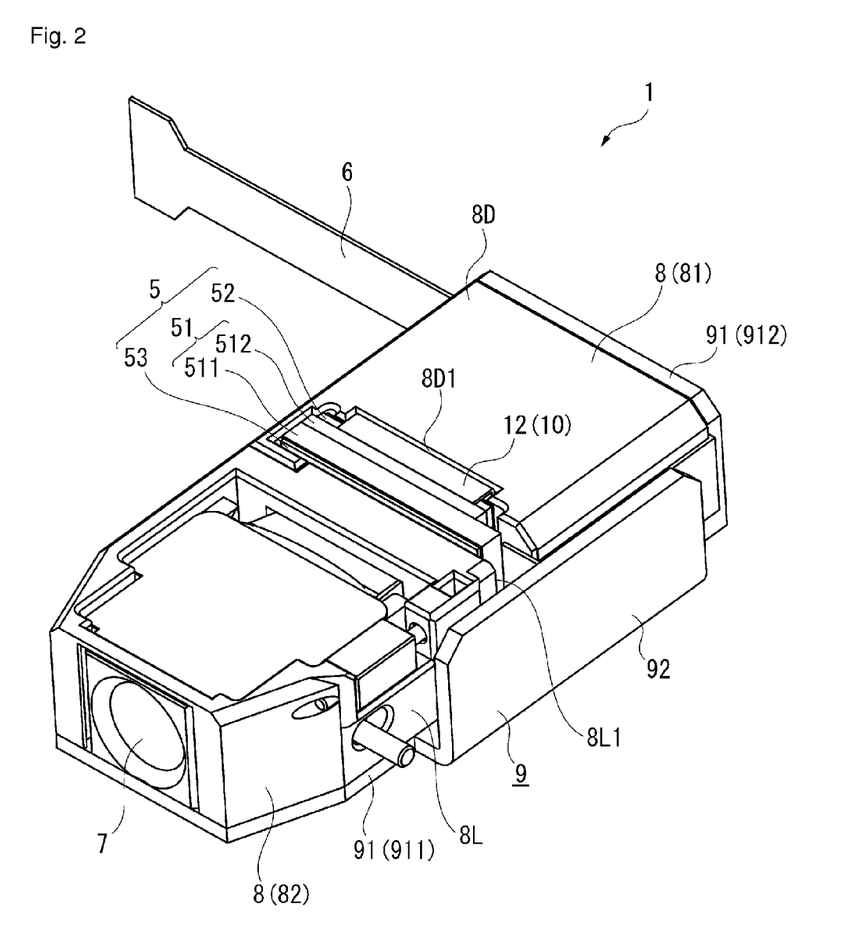
FIG. 2 is a diagram showing the configuration of the projector in the embodiment.
Figure 3:
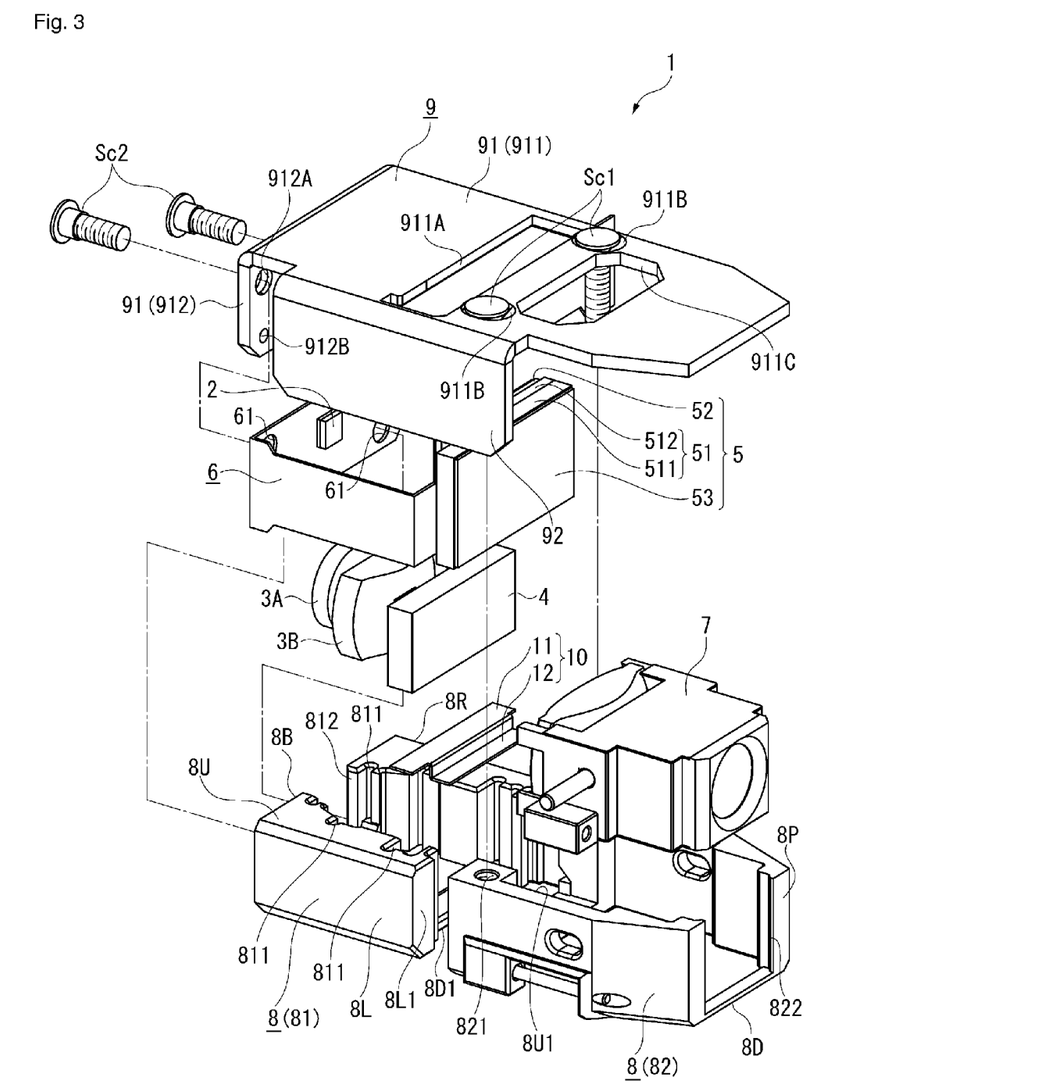
FIG. 3 is a diagram showing the configuration of the projector in the embodiment.
Figure 4:
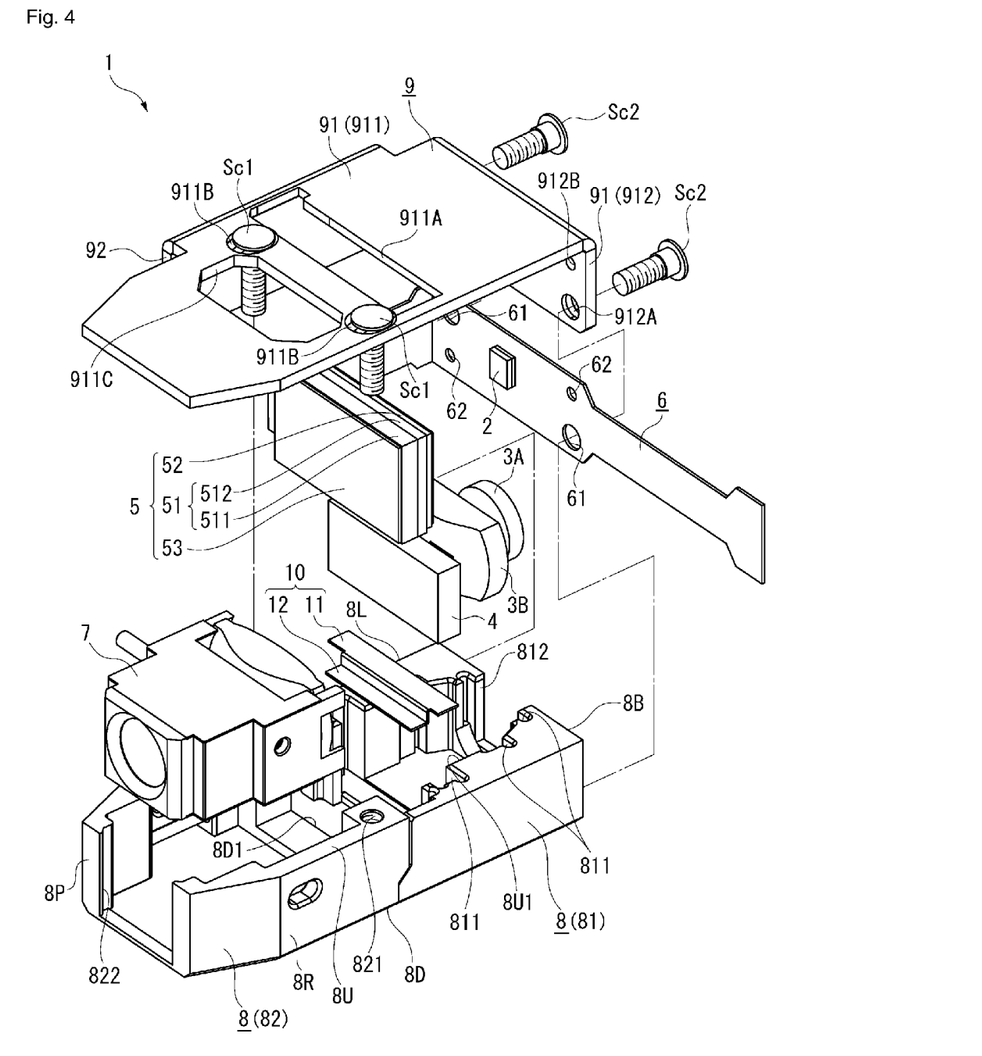
FIG. 4 is a diagram showing the configuration of the projector in the embodiment.

An embodiment of the invention is explained below with reference to the drawings.
Configuration of a Projector FIGS. 1 to 4 are diagrams showing the configuration of a projector 1 in this embodiment. Specifically, FIG. 1 is a perspective view of the projector 1 viewed from the top surface side (the upper side). FIG. 2 is a perspective view of the projector 1 viewed from the bottom surface side (the lower side). FIGS. 3 and 4 are disassembled perspective views of the projector 1 viewed from the upper side.

The projector 1 projects an image and displays the projected image on a screen (not shown in the figures).

The projector 1 in this embodiment is configured as a small optical module (a pico-projector) mounted on an electronic device (not shown in the figures) such as a digital camera, a cellular phone, or a notebook PC.

As shown in FIGS. 1 to 4, the projector 1 includes a light source device 2 (FIGS. 3 and 4), first and second lenses 3A and 3B (FIGS. 3 and 4), a polarizing beam splitter 4 (FIGS. 3 and 4), a liquid crystal panel 5 functioning as a light modulating device, a flexible printed circuit board (hereinafter, FPC) 6, a projection lens 7 functioning as a projection optical device, a housing 8, and a connecting member 9.

With the configuration explained above, a light beam emitted from the light source device 2 is, after being converted into substantially parallel beams by the first and second lenses 3A and 3B, converted into linearly polarized light of practically one kind by the polarizing beam splitter 4. The light beam (the linearly polarized light) converted by the polarizing beam splitter 4 is, after being modulated by the liquid crystal panel 5, projected on a screen (not shown in the figures) by the projection lens 7.
Configuration of the Light Source Device, the Liquid Crystal Panel, and the FPC FIG. 5 is a diagram for explaining the configuration of the light source device 2, the liquid crystal panel 5, and the FPC 6.

The liquid crystal panel 5 modulates an incident light beam under the control by a control board (not shown in the figure) provided on the inside of the electronic device.

Figure 5:
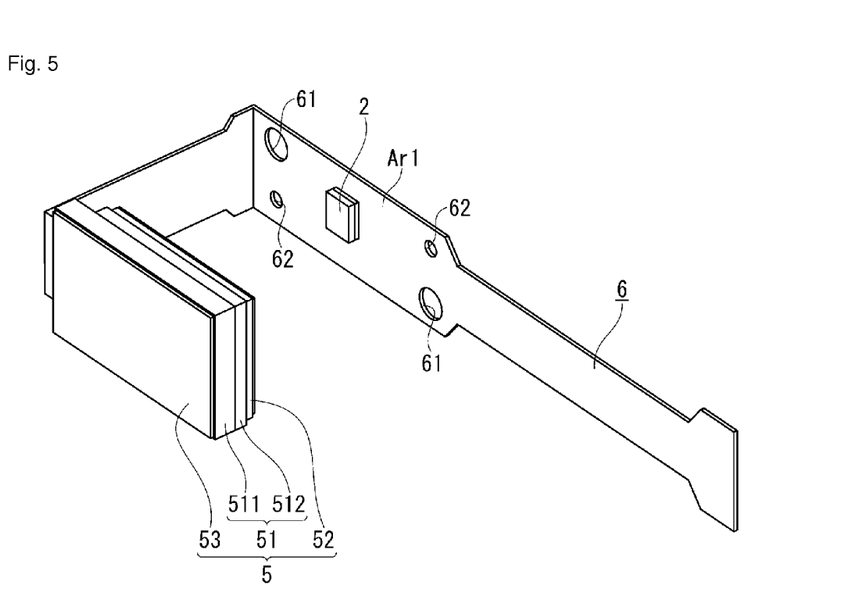
FIG. 5 is a diagram for explaining the configuration of a light source device, a light modulating device, and an FPC in the embodiment.

In this embodiment, as shown in FIG. 5, the liquid crystal panel 5 includes a transmissive liquid crystal panel including a panel body 51, an incident side polarizer 52, and an emission side polarizer 53.

As shown in FIG. 5, the panel body 51 includes a configuration in which liquid crystal, which is an electro-optical substance, is hermetically sealed in a pair of substrates 511 and 512 having a rectangular shape in plan view made of glass or the like.

The substrate 511 of the pair of substrates 511 and 512 is a driving substrate for driving the liquid crystal. The substrate 511 includes plural data lines formed to be arrayed in parallel to one another, plural scanning lines formed to be arrayed in a direction orthogonal to the plural data lines, pixel electrodes formed to be arrayed in a matrix shape to correspond to crossing of the scanning lines and the data lines, a switching device such as a TFT (Thin Film Transistor), and a driving circuit that drives the switching device.

The substrate 512 is an opposed substrate arranged to be opposed to the substrate 511 at a predetermined space therefrom on a light incident side of the substrate 511. The substrate 512 includes a common electrode to which a predetermined voltage Vcom is applied.

A signal is input to the substrate 512 from the control board via the FPC 6 (a signal line for driving of the liquid crystal panel 5), whereby a voltage is applied between a predetermined one of the pixel electrodes and the common electrode, an oriented state of the liquid crystal interposed between the pixel electrode and the common electrode is controlled, and an incident light beam is modulated.

The incident side polarizer 52 is attached to a light incident surface of the panel body 51. The incident side polarizer 52 transmits only predetermined linearly polarized light (linearly polarized light converted by the polarizing beam splitter 4).

The emission side polarizer 53 is attached to a light emission surface of the panel body 51. The emission side polarizer 53 transmits only linearly polarized light having a polarization direction orthogonal to a polarization direction of the linearly polarized light converted by the polarizing beam splitter 4.

The FPC 6 is formed by, for example, patterning a signal wire (the signal line for driving of the liquid crystal panel 5, a power supply line for supplying electric power to the light source device 2, a signal line for lighting control for the light source device 2, etc.) on a base material of polyimide or the like. The FPC 6 electrically connects the control board to the liquid crystal panel 5 and the light source device 2.

Specifically, one end side of the FPC 6 is electrically connected to, by compression bonding or the like, an external circuit connection terminal (not shown in the figures) formed near an end of the liquid crystal panel 5.

A connector (not shown in the figures) is provided on the other end side of the FPC 6. The FPC 6 is electrically connected to the control board via the connector.

In the FPC 6, a positioning structure for positioning the light source device 2 (hereinafter, the positioning structure for the light source device 2) is provided in an emission position for emitting a light beam to the liquid crystal panel 5. However, the positioning structure is explained below.

As shown in FIG. 5, the light source device 2 includes an LED functioning as a light-emitting device and is mounted on the FPC 6.

Electric power for lighting is supplied to the light source device 2 from the control board via the power supply line (not shown in the figure) formed on the FPC 6. A signal is input to the light source device 2 from the control board via the signal line for lighting control for the light source device 2 formed on the FPC 6. In this way, the light source device 2 is subjected to lighting control.

Configuration of the Housing

In the housing 8, the light source device 2, the first and second lenses 3A and 3B, the polarizing beam splitter 4, the liquid crystal panel 5, and the projection lens 7 are housed.

In this embodiment, as shown in FIG. 3 or 4, the housing is configured to linearly dispose the light source device 2, the first and second lenses 3A and 3B, the polarizing beam splitter 4, the liquid crystal panel 5, and the projection lens 7.

As shown in FIG. 3 or 4, the housing 8 includes a first housing section 81 and a second housing section 82 formed separate from each other. The housing 8 is formed to have a substantially rectangular parallelepiped shape by combining the first and second housing sections 81 and 82 with each other.

In the following explanation, for convenience of explanation, on the outer surfaces of the housing 8, a surface on the upper side is referred to as first side surface 8U, a surface on the left side viewed from a projection side in FIGS. 3 and 4 is referred to as second side surface 8L, a surface on the lower side is referred to as third side surface 8D, a surface on the right side viewed from the projection side in FIGS. 3 and 4 is referred to as fourth side surface 8R, a surface on the projection side is referred to as fifth side surface 8P, and a surface opposed to the fifth side surface 8P is referred to as sixth side surface 8B.

As shown in FIG. 3 or 4, the housing 8 is formed in a container shape having a first opening 8U1 on the first side surface 8U.

The first housing section 81 is a section in which the light source device 2, the first and second lenses 3A and 3B, and the polarizing beam splitter 4 are housed.

In the first housing section 81, on the inner surface, as shown in FIG. 3 or 4, plural grooves 811 are formed. The plural grooves 811 are used for sliding the first and second lenses 3A and 3B and the polarizing beam splitter from the first side surface 8U side to and disposing the first and second lenses 3A and 3B and the polarizing beam splitter 4 on the inside of the first housing section 81.

In the first housing section 81, on the sixth side surface 8B, as shown in FIG. 3 or 4, an opening for light source 812 is formed. The opening for light source 812 communicates with the inside and the outside of the first housing section 81, communicates with the first opening 8U1 as well, and is used for disposing the light source device 2 on the inside of the first housing section 81.

On the sixth side surface 8B in the first housing section 81, as in the FPC 6, the positioning structure for the light source device 2 is provided. However, the positioning structure is explained below.

The second housing section 82 is a section in which the projection lens 7 is housed.

In the second housing section 82, on the first side surface 8U, as shown in FIG. 3 or 4, a pair of first screw holes 821 are formed in order to connect the second housing section 82 and the connecting member 9. In the pair of first holes 821, a pair of first fixing screws Sc1 are respectively screwed.

In the second housing section 82, on the fifth side surface 8P, as shown in FIG. 3 or 4, an opening for passage 822 is formed. The opening for passage 822 communicates with the inside and the outside of the second housing section 82, communicates with the first opening 8U1 as well, and is used for allowing a light beam projected by the projection lens 7 to pass.

In the housing 8 explained above, in a state in which the first and second housing sections 81 and 82 are combined, the liquid crystal panel 5 is disposed between the first and second housing sections 81 and 82 (a connecting position of the first and second housing sections 81 and 82) via a sheet metal member 10 (FIGS. 3 and 4) explained below.

On the second side surface 8L, in the connecting position of the first and second housing sections 81 and 82, as shown in FIG. 2 or 3, a first insert-through section 8L1 for drawing around the FPC 6 to the outside of the housing 8 is formed.

Similarly, on the third side surface 8D, in the connecting position of the first and second housing sections 81 and 82, as shown in FIGS. 2 to 4, a second insert-through section 8D1 through which a part of the liquid crystal panel 5 is inserted is formed.

Specifically, in the state in which the first and second housing sections 81 and 82 are combined with each other, the first and second housing sections 81 and 82 are set such that ends thereof on the second side surface 8L side separate a predetermined space from each other. The separating portions function as the first insert-through section 8L1 explained above. The same applies to the second insert-through section 8D1.

As shown in FIG. 3 or 4, the sheet metal member 10 is a member formed such that a first plate section 11 and a second plate section 12 having a tabular shape are parallel to each other while having a step therebetween.

The first plate section 11 is held between the polarizing beam splitter 4 and the bottom of the first housing section 81 in a state in which the polarizing beam splitter 4 is housed in the first housing section 81.

As shown in FIG. 2, the second plate section 12 is drawn out to the outside of the housing 8 via the second insert-through section 8D1. The liquid crystal panel 5 is placed and fixed on the second plate section 12.

As shown in FIG. 1, a part of the liquid crystal panel 5 projects from the first opening 8U1 in a state in which the liquid crystal panel 5 is housed in the housing 8 via the sheet metal member 10. As shown in FIG. 2, a part of the liquid crystal panel 5 inserted through the second insert-through section 8D1 is substantially flush with the third side surface 8D.

Configuration of the Connecting Member

The connecting member 9 is a member that is connected to the first and second housing sections 81 and 82 and integrates the first and second housing sections 81 and 82. As shown in FIG. 3 or 4, the connecting member 9 includes a connecting member body 91 and a reinforcing section 92.

As shown in FIG. 3 or 4, the connecting member body 91 includes a tabular lid section 911 having a planar shape substantially the same as the shape of the first side surface 8U of the housing 8 and a tabular light source connecting section 912 having a planar shape substantially the same as the shape of the sixth side surface 8B of the housing 8.

The lid section 911 functions as a lid body that comes into contact with the first side surface 8U and closes the first opening 8U1 in a state in which the connecting member 9 is connected to the housing 8.

In the lid section 911, in a position corresponding to a disposed position of the liquid crystal panel 5, as shown in FIG. 1, 3, or 4, a second opening 911A having a substantially rectangular shape is formed. The part of the liquid crystal panel 5 projecting from the first opening 8U1 is inserted through the second opening 911A in a state in which the connecting member 9 is connected to the housing 8.

In the lid section 911, in positions corresponding to the pair of first screw holes 821 of the housing 8, as shown in FIG. 3 or 4, a pair of fixing holes 911B are formed in order to connect the second housing section 82 and the connecting member 9. The pair of first fixing screws Sc1 are respectively inserted through the pair of fixing holes 911B.

Further, in the lid section 911, in a position corresponding to a disposed position of the projection lens 7, as shown in FIG. 1, 3, or 4, a substantially rectangular opening for lens 911C is formed. The opening for lens 911C is used for exposing a part of the projection lens 7 to the outside in a state in which the connecting member 9 is connected to the housing 8.

The light source connecting section 912 substantially vertically hangs down from the end edge on the sixth side surface 8B side in the lid section 911 and holds the FPC 6 between the light source connecting section 912 and the sixth side surface 8B in a state in which the connecting member 9 is connected to the housing 8.

The light source connecting section 912 corresponds to the holding member according to the invention.

In the light source connecting section 912, as in the FPC and the first housing section 81, the positioning structure for the light source device 2 is provided. However, the positioning structure is explained below.

The reinforcing section 92 includes a rectangular plate member substantially vertically hanging down from the end edge on the second side surface 8L side in the lid section 911. As shown in FIG. 1 or 2, the reinforcing section 92 is disposed to be opposed to the second side surface 8L at a predetermined space therefrom to extend over a connecting position of the first and second housing sections 81 and 82 in a state in which the connecting member 9 is connected to the housing 8.

The connecting member 9 explained above is formed of a thermally conductive material such as copper.

Positioning Structure for the Light Source Device

Figure 6:
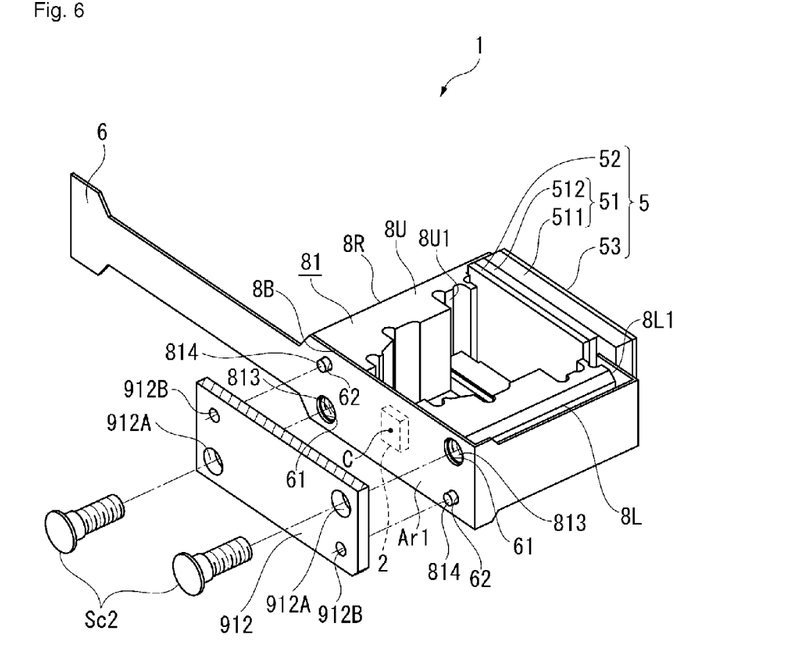
FIG. 6 is a diagram for explaining a positioning structure of the light source device in the embodiment.

FIG. 6 is a diagram for explaining the positioning structure for the light source device 2. Specifically, FIG. 6 is a disassembled perspective view of the first housing section 81, the FPC 6, and the light source connecting section 912 viewed from the sixth side surface 8B side.

First, a positioning structure provided in the FPC 6 is explained.

As shown in FIG. 6, in the FPC 6, the width dimension of an area (an area arranged to be opposed to the sixth side surface 8B) Ar1 including a mounting position C where the light source device 2 is mounted is set substantially the same as the height dimension (the dimension in the up down direction in FIG. 6) of the sixth side surface 8B and set to be larger than the width dimension of the other areas.

In the area Ar1, a pair of first fixing holes 61 are formed to be opposed to each other centering around the mounting position C. In the pair of first fixing holes 61, a pair of second fixing screws Sc2 are respectively screwed.

In the area Ar1, a pair of first positioning holes 62 are formed in a position avoiding the pair of first fixing holes 61 to be opposed to each other centering around the mounting position C.

A positioning structure provided in the first housing section 81 is explained.

On the sixth side surface 8B of the first housing section 81, in positions corresponding to the pair of first fixing holes 61, as shown in FIG. 6, a pair of second screw holes 813 are formed in order to connect the first housing section 81 and the connecting member 9. In the pair of second screw holes 813, the pair of second fixing screws Sc2 are respectively screwed.

On the sixth side surface 8B, in positions corresponding to the pair of first positioning holes 62, a pair of positioning protrusions 814 are formed. The pair of positioning protrusions 814 respectively fit in the pair of first positioning holes 62.

A positioning structure provided in the light source connecting section 912 is explained.

In the light source connecting section 912, in positions corresponding to the pair of first fixing holes 61, as shown in FIG. 6, a pair of second fixing holes 912A are formed in order to connect the connecting member 9 and the first housing section 81. The pair of second fixing screws Sc2 are respectively inserted through the pair of second fixing holes 912A.

In the light source connecting section 912, in positions corresponding to the pair of first positioning holes 62, a pair of second positioning holes 912B are formed. The pair of positioning protrusions 814 respectively fit in the pair of second positioning holes 912B.

With the positioning structure explained above, the light source device 2 is positioned in the emission position for emitting a light beam to the liquid crystal panel 5.

First, in a state in which the liquid crystal panel 5 is inserted into the inside of the housing 8 via the first opening 8U1 and disposed in the connecting position of the first and second housing sections 81 and 82, as shown in FIG. 6, the FPC 6 is drawn around from the second side surface 8L side of the housing 8 to the outside via the first insert-through section 8L1.

The FPC 6 is bent about 90 degrees to the sixth side surface 8B side along the second side surface 8L of the first housing section 81 and further bent about 90 degrees to the fourth side surface 8R side along the sixth side surface 8B.

The pair of positioning protrusions 814 of the first housing section 81 are fit in the pair of positioning holes 62 of the FPC 6, whereby the light source device 2 is positioned in the emission position.

In other words, in the FPC 6, the portion between the pair of first positioning holes 62 and the one end connected to the liquid crystal panel 5 is bent along the outer surface of the housing 8 as explained above.

The pair of second positioning holes 912B of the light source connecting section 912 are fit in the pair of positioning protrusions 814 of the first housing section 81. The first and second fixing screws Sc1 and Sc2 are screwed in the first and second screw holes 821 and 813 via the holes 911B, 912A, and 61.

The first and second fixing screws Sc1 and Sc2 are screwed in this way, whereby the first and second housing sections 81 and 82 are integrated by the connecting member 9 and the area Ar1 is held between the sixth side surface 8B of the first housing section 81 and the light source connecting section 912.

In this state, the light source connecting section 912 is connected to the light source device 2 via the area Ar1 (patterned wiring) of the FPC 6 to be capable of transmitting heat. As shown in FIG. 1, a part of the liquid crystal panel 5 projecting from the first opening 8U1 is substantially flush with the upper surface of the lid section 911.

According to the embodiment explained above, effects explained below are obtained.

In this embodiment, the light source device 2 includes an LED and is mounted on the FPC 6, one end of which is connected to the liquid crystal panel 5.

Consequently, connecting paths between a control board (not shown in the figures), which controls the operations of the light source device 2 and the liquid crystal panel 5, and the liquid crystal panel 5 and between the control board and the light source device 2 can be integrated into one path (one FPC 6). Therefore, it is possible to simplify wiring between the control board and the liquid crystal panel 5 and between the control board and the light source device 2 and realize a reduction in the size of the projector 1.

In particular, the projector 1 according to this embodiment is configured as a pico-projector. Therefore, the projector 1 is suitable because it is possible to design the projector 1 to a sufficiently small desired size.

Compared with the configuration in the past, it is unnecessary to separately provide, for example, a mounting board for mounting the LED, a flexible printed circuit board for connecting the mounting board and the control board, and a connector to which the flexible printed circuit board is connected. Therefore, since the number of components is reduced, it is possible to realize a further reduction in the size of the projector 1 and reduce manufacturing costs for the projector 1.

The FPC 6 is bent, whereby the light source device 2 is disposed in an emission position where the light source device 2 emits a light beam to the liquid crystal panel 5.

Consequently, the light source device 2 can be disposed in the emission position simply by bending the FPC 6. Therefore, it is possible to easily carry out assembly of the projector 1.

Further, since the positioning protrusions 814 are formed on the housing 8 and the first positioning holes 62 are formed on the FPC 6, simply by fitting the positioning protrusions 814 in the first positioning holes 62, it is possible to easily position the light source device 2 in the emission position while simplifying the structure of the projector 1.

The FPC 6 is drawn around to the outside of the housing 8 via the first insert-through section 8L1 and the portion between the first positioning holes 62 and the one end connected to the liquid crystal panel 5 is bent along the outer surface of the housing 8.

Consequently, by bringing the FPC 6 into contact with the outer surface of the housing 8 while bending the FPC 6 as explained above, it is possible to satisfactorily maintain a fit state of the positioning protrusions 814 in the first positioning holes 62, i.e., satisfactorily maintain a positioned state of the light source device 2 in the emission position.

Further, the projector 1 includes the light source connecting section 912 and the area Ar1 of the FPC 6 is held between the light source connecting section 912 and the outer surface of the housing 8. Therefore, it is possible to more satisfactorily maintain the fit state of the positioning protrusions 814 in the first positioning holes 62, i.e., more satisfactorily maintain the positioned state of the light source device 2 in the emission position.

Since the area Ar1 of the FPC 6 is held between the tabular light source connecting section 912 and the outer surface (the sixth side surface 8B formed by a plane) of the housing 8, it is possible to improve the flatness of the area Ar1. Therefore, it is possible to set an emitting direction of a light beam from the light source device 2 in a desired direction while satisfactorily maintaining the positioned state of the light source device 2 in the emission position.

The light source connecting section 912 is made of a thermally conductive material and connected to the light source device 2 via the area Ar1 of the FPC 6 to be capable of transmitting heat.

Consequently, it is possible to radiate heat generated by lighting driving for the light source device 2 to the outside through a heat transmission path from the light source device 2 to the FPC 6 (patterned wiring) and the light source connecting section 912 while satisfactorily maintaining the positioned state of the light source device 2 in the emission position. Therefore, it is possible to effectively suppress heat deterioration of the light source device 2.

Further, the FPC 6 is formed such that the width dimension of the area Ar1 is large compared with the width dimension of the other portions. In other words, it is possible to increase the heat capacity of the area Ar1 where the light source device 2 is mounted compared with the other areas. Therefore, it is possible to effectively radiate heat generated by lighting driving for the light source device 2 to the area Ar1 and further transmit the heat from the area Ar1 to the light source connecting section 912. Therefore, it is possible to effectively suppress heat deterioration of the light source device 2.

The second opening 911A is formed in the lid section 911. Therefore, it is possible to suppress heat transmitted to the lid section 911 from being transmitted to the liquid crystal panel 5 through the heat transmission path from the light source device 2 to the FPC 6 and the light source connecting section 912.

Further, the reinforcing section 92 is disposed to be opposed to the second side surface 8L at a predetermined space therefrom. Therefore, it is possible to prevent the reinforcing section 92 from being connected to the FPC 6, which is bent along the second side surface 8L, to be capable of transmitting heat and suppress heat transmitted to the reinforcing section 92 from being transmitted to the FPC 6 through the heat transmission path from the light source device 2 to the FPC 6 and the light source connecting section 912.

The first and second insert-through sections 8L1 and 8D1 are formed by combining the first and second housing sections 81 and 82.

Consequently, for example, compared with the housing 8 formed of one member, it is possible to easily form the first and second insert-through sections 8L1 and 8D1.

Further, since the illuminating systems 2, 3A, 3B, and 4 are housed in the first housing section 81 and the projection lens 7 is housed in the second housing section 82, it is possible to easily carry out adjustment (optical axis adjustment) of a positional relation between the illuminating systems 2, 3A, 3B, and 4 and the projection lens 7 in a state in which these optical components are housed in the housing 8.

Since the projector 1 includes the connecting member 9, even if the housing 8 includes the first and second housing sections 81 and 82 formed separate from each other, it is possible to integrate the first and second housing sections 81 and 82 using the connecting member 9 and increase the strength of the housing 8.

Further, since the connecting member 9 includes the connecting member body 91 and the reinforcing section 92, it is possible to effectively increase the strength of the housing 8 by reinforcing the housing 8 with the connecting member body 91 and the reinforcing section 92 from the sides of the different two surfaces (the first and second side surfaces 8U and 8L) to extend over the connecting position of the first and second housing sections 81 and 82 where strength is low.

The first insert-through section 8L1 is formed on the second side surface 8L. In other words, when the FPC 6 is drawn around to the outside of the housing 8 via the first insert-through section 8L1, the FPC 6 is drawn around to the side where the reinforcing section 92 is disposed.

Consequently, it is possible to close the first insert-through section 8L1 and prevent a deficiency from occurring in the connecting portion of the liquid crystal panel 5 and the FPC 6 while reinforcing the housing 8 with the reinforcing section 92.

The FPC 6 bent along the outer surface of the housing 8 is protected by the reinforcing section 92 and the light source connecting section 912.

Consequently, even when the projector 1 is incorporated in the inside of an electronic device such as a digital camera, a cellular phone, or a notebook PC or when the projector 1 is transported, it is possible to prevent the FPC 6 from being broken.

The connecting member 9 includes a function (the light source connecting section 912) of maintaining the positioned state of the light source device 2 in the emission position while including a function (the lid section 911 and the reinforcing section 92) of increasing the strength of the housing 8.

Consequently, simply by connecting the single connecting member 9 to the housing 8, it is possible to maintain the positioned state of the light source device 2 in the emission position while increasing the strength of the housing 8. In other words, it is possible to easily carry out assembly of the projector 1.

The invention is not limited to the embodiment explained above. Modifications, improvements, and the like within a range in which the object of the invention can be attained are included in the invention.

In the embodiment, the liquid crystal panel 5 includes a transmissive liquid crystal panel. However, the liquid crystal panel 5 is not limited to this and may include a reflective liquid crystal panel.

In the liquid crystal panel 5, color filters may be provided as appropriate to display three colors of red (R), green (G), and blue (B) for each of pixels and form a color image.

In the embodiment, the housing 8 includes the two members of the first and second housing sections 81 and 82 formed separate from each other. However, the housing 8 is not limited to this and may include one member.

In the embodiment, the light source device 2 includes the LED. However, the light source device 2 is not limited to this and may adopt another light emitting device such as a laser diode, an organic EL (Electro Luminescence) device, or a silicon light emitting device.

INDUSTRIAL APPLICABILITY

The invention can be applied in a projector including a light source device, a light modulating device that modulates a light beam emitted from the light source device, and a projection optical device that projects the light beam modulated by the light modulating device.

The entire disclosure of Japanese Patent Application No.: 2011-138236, filed Jun. 22, 2011 and 2012-056945, filed Mar. 14, 2012 are expressly incorporated by reference herein.

What is claimed is:

1. A projector comprising:
   a light source device,
   a light modulating device configured to modulate a light beam emitted from the light source device,
   a projection optical device configured to project the light beam modulated by the light modulating device,
   a housing in which the light source device, the light modulating device, and the projection optical device are housed,
   a flexible printed circuit board, one end of which is directly connected to the light modulating device, wherein
   a positioning for positioning the light source device in the emission position is formed on an outer surface of the housing,
   the flexible printed circuit board includes a positioning hole in which the positioning protrusion is fitted, and the positioning protrusion fits in the positioning hole to position the light source device in the emission position,
   an insert-through section for drawing around the flexible printed circuit board to an outside of the housing is formed in the housing,
   the light source device includes a light emitting device mounted on the flexible printed circuit board, and the flexible printed circuit board is bent, whereby the light source device is disposed in an emission position where the light source device emits the light beam to the light modulating device, and
   the flexible printed circuit board is drawn around to the outside of the housing via the insert-through section, and a portion between the positioning hole and the one end is bent along the outer surface of the housing.

2. The projector according to claim 1, wherein the positioning protrusion is formed on an outer surface of the housing,
   in the housing, a screw hole in which a screw is screwed and an insert-through section for drawing around the flexible printed circuit board to an outside of the housing are formed,
   the flexible printed circuit board includes a first fixing hole through which the screw is inserted, and
   the projector comprises a second fixing hole through which the screw is inserted and a holding member connected to the housing by the screw and configured to hold a part of the flexible printed circuit board between the holding member and the outer surface of the housing.

3. The projector according to claim 2, wherein the holding member is made of a thermally conductive material and is connected to the light source device via the flexible printed circuit board to be capable of transmitting heat.

4. The projector according to claim 1, wherein the flexible printed circuit board is formed such that a width dimension of a portion where the light source device is mounted is larger than a width dimension of the other portions.

5. A projector including a light source device configured to mount on a flexible printed circuit board, a light modulating device configured to modulate a light beam emitted from the light source device, a projection optical device configured to project the light beam modulated by the light modulating device, and a housing in which the light source device, the light modulating device, and the projection optical device are housed, wherein
the housing includes a first housing section and a second housing section formed separate from each other and combined with each other, and
the light modulating device is disposed in a connecting position of the first housing section and the second housing section.

6. The projector according to claim 5, further comprising a connecting member configured to integrate the first housing section and the second housing section.

7. The projector according to claim 5, wherein
the housing is formed to have a substantially rectangular parallelepiped shape by combining the first housing section and the second housing section,
the connecting member includes:
a connecting member body attached to a first side surface of the housing to extend over the connecting position; and
a reinforcing section configured to project from the connecting member body and disposed to be opposed to a second side surface different from the first side surface in the housing to extend over the connecting position.

8. The projector according to claim 5, wherein the insert-through section is formed on the second side surface.

9. The projector according to claim 5, wherein
on an outer surface of the housing, a positioning protrusion for positioning the light source device in the emission position and a screw hole in which a screw is fitted are formed,
the flexible printed circuit board includes a first fixing hole through which the screw is inserted and a positioning hole in which the positioning protrusion is fitted, and the positioning protrusion is fitted in the positioning hole to position the light source device in the emission position, and
the connecting member includes a second fixing hole through which the screw is inserted and a holding member connected to the housing by the screw and configured to hold a part of the flexible printed circuit board between the holding member and the outer surface of the housing.

* * * * *